(12) United States Patent
Stecher

(10) Patent No.: US 7,470,993 B2
(45) Date of Patent: Dec. 30, 2008

(54) SEMICONDUCTOR COMPONENT WITH PASSIVATION LAYER

(75) Inventor: Matthias Stecher, München (DE)

(73) Assignee: Infineon Technologies AG, Munich (DE)

( * ) Notice: Subject to any disclaimer, the term of this patent is extended or adjusted under 35 U.S.C. 154(b) by 107 days.

(21) Appl. No.: 11/313,178

(22) Filed: Dec. 20, 2005

(65) Prior Publication Data

US 2006/0163742 A1     Jul. 27, 2006

(30) Foreign Application Priority Data

Dec. 20, 2004   (DE)   ................ 10 2004 061 307

(51) Int. Cl.
*H01L 23/48* (2006.01)
(52) U.S. Cl. ................ 257/766; 257/E23.132; 438/127; 438/958
(58) Field of Classification Search ........ 257/758, 257/761, 763, 766, 770, 775, E23.132; 438/127, 438/958
See application file for complete search history.

(56) References Cited

U.S. PATENT DOCUMENTS

| | | | | |
|---|---|---|---|---|
| 4,310,569 A | * | 1/1982 | Harrington | ........ 438/654 |
| 4,970,574 A | * | 11/1990 | Tsunenari | ........ 257/753 |
| 5,494,853 A | * | 2/1996 | Lur | ........ 438/631 |
| 5,716,888 A | * | 2/1998 | Lur et al. | ........ 438/619 |
| 5,742,094 A | * | 4/1998 | Ting | ........ 257/620 |
| 5,811,874 A | | 9/1998 | Lee | |
| 6,359,328 B1 | * | 3/2002 | Dubin | ........ 257/622 |
| 2003/0197280 A1 | | 10/2003 | Davis et al. | |

FOREIGN PATENT DOCUMENTS

| WO | WO 99/20089 | 4/1999 |
|---|---|---|
| WO | WO 03/085735 | 10/2003 |

OTHER PUBLICATIONS

German Office Action dated Dec. 7, 2006.
Huang, M. et al., "Thin Film Cracking and Ratcheting Caused by Temperature Cycling," J. Mater. Res., vol. 15, No. 6, pp. 1239-1242 (Jun. 2000).
Sauber, John, "Modeling of Die Surface Features on Integrated Circuits to Improve Device Reliability," Digital Equipment Corporation, pp. 1-14, date unknown.

* cited by examiner

*Primary Examiner*—Asok K Sarkar
(74) *Attorney, Agent, or Firm*—Dicke, Billig & Czaja, PLLC

(57) ABSTRACT

A semiconductor component has a semiconductor body and also a metal/insulation structure arranged above the semiconductor body and having a plurality of metal regions and insulation regions laterally adjoining one another. The metal regions serve for supplying the semiconductor body with electric current. Furthermore, the semiconductor component has a passivation layer arranged on the metal/insulation structure. The passivation layer includes a metal or a metal-containing compound.

19 Claims, 7 Drawing Sheets

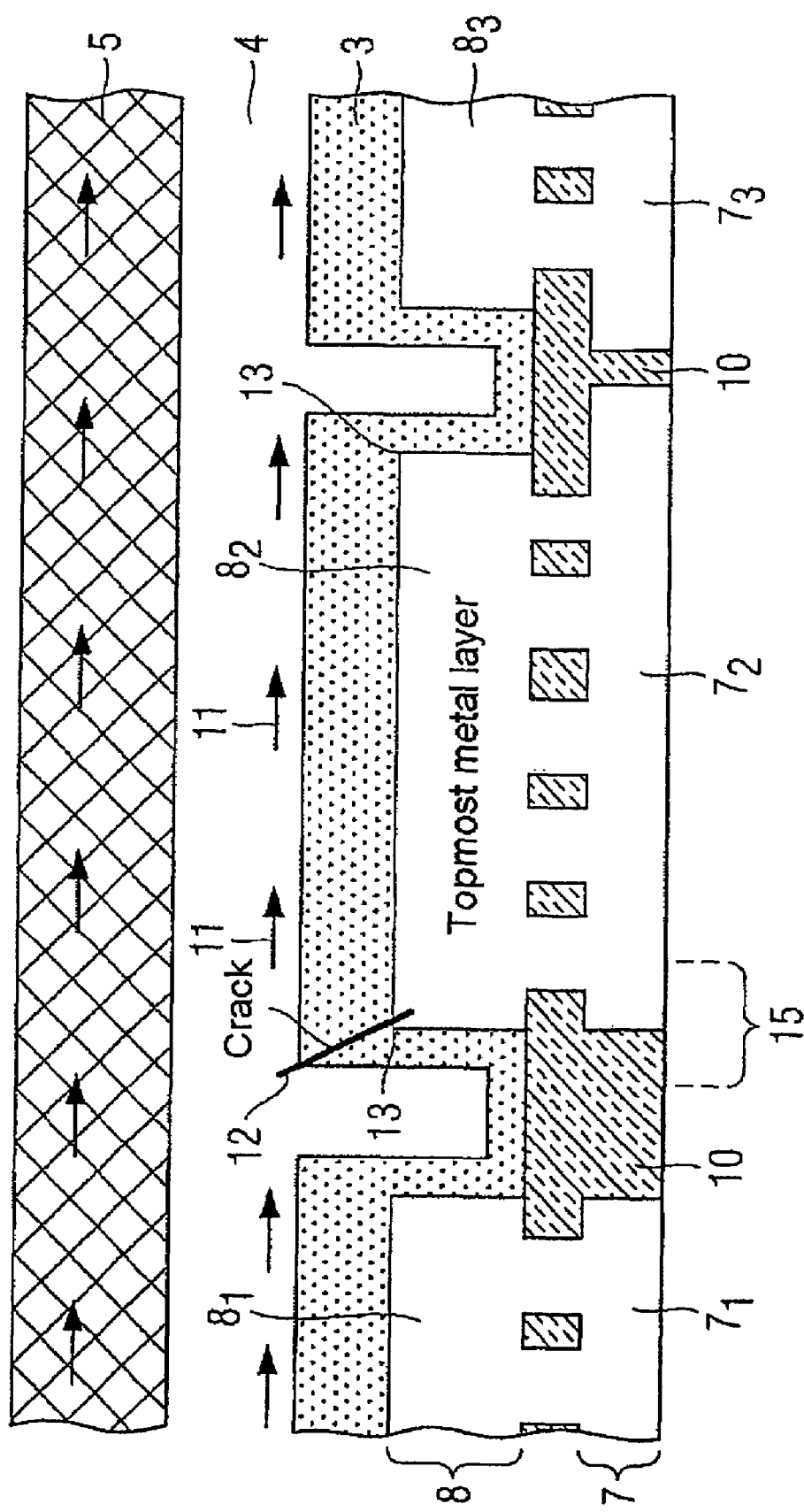

SEMICONDUCTOR COMPONENT WITH PASSIVATION LAYER

CROSS-REFERENCE TO RELATED APPLICATIONS

This Utility patent application claims priority to German Patent Application No. DE 10 2004 061 307.9, filed on Dec. 20, 2004, which is incorporated herein by reference.

BACKGROUND

The invention relates to a semiconductor component with passivation layer.

Semiconductor components are generally provided with a passivation layer in order to minimize the influences of the environment, for example temperature fluctuations or moisture, on the semiconductor components. The passivation layer may furthermore serve for mechanical stabilization of the semiconductor components.

If a semiconductor component with passivation layer is exposed to severe temperature fluctuations, then cracks may arise in the passivation layer on account of different coefficients of thermal expansion of the passivation layer and of regions of the semiconductor component which adjoin the passivation layer. This is the case, for example, when the semiconductor component is closed off toward the outside by a molding compound adjoining the passivation layer, since the coefficients of thermal expansion of the passivation layer and the molding compound may deviate greatly from one another. If a crack arises within a critical region of the semiconductor component, for example in a region that insulates two conductive regions from one another, then the crack may lead to the impairment of the functioning of the semiconductor component. In the worst case, the cracking leads to a total failure of the semiconductor component.

The problem area described above is explained by way of example in the description below with reference to FIGS. 1 to 3.

FIG. 1 illustrates a cross section through a detail from a typical power semiconductor component. Arranged on a semiconductor body 1, which includes silicon in this embodiment, is a metal/insulation structure 2, which is in turn covered by a passivation layer 3. A buffer layer 4 is provided on the passivation layer 3, a molding compound layer 5, which functions as housing termination, in turn being arranged on said buffer layer. In this embodiment, the metal/insulation structure 2 has a first to third metal plane 6, 7 and 8, which are electrically connected to one another by conductive connections 9. The metal planes 6, 7, 8 are divided into different metal plane regions (in this embodiment, the first metal plane 6 is divided into five metal plane regions $6_1$-$6_5$, and the second and third metal planes 7, 8 are divided into in each case three metal plane regions $7_1$-$7_3$ and $8_1$-$8_3$, respectively) which are electrically insulated from one another by insulation structures 10.

Since the coefficients of thermal expansion of the passivation layer 3 and the molding compound layer 5 generally turn out to be greatly different, great tensile forces oriented in the lateral direction occur at the transition between the passivation layer 3 and the buffer layer 4 in the event of temperature fluctuations, which is indicated by the arrows 11 illustrated in FIG. 2. If the tensile stresses exceed specific threshold values, then cracks 12 arise within the passivation layer 2. The cracks 12 arise in particular in regions of the passivation layer 3 which adjoin edges 13 of the topmost metal plane (third metal plane 8).

FIG. 3A illustrates a micrograph of a region from FIG. 2 which is identified by reference numeral 15. A crack 12 can clearly be seen, said crack having formed at an edge 13 of the metal region $8_2$ within the passivation layer 3. The crack 12 illustrated in FIG. 3A is noncritical since moisture cannot pass into the semiconductor body 1 or into insulating intermediate regions (insulation structure 10) via said crack.

The situation proves to be more critical in a case such as is illustrated in FIG. 3B. FIG. 3B illustrates a plan view of a semiconductor component with a metallization 16. The metallization 16 is pervaded or interrupted by insulating regions 17. A passivation layer (transparent here) is provided above the metallization 16 and the insulating regions 17, cracks 12 having arisen in said passivation layer due to thermal stress. The cracks 12 run above the insulating regions 17 and thus constitute a risk that has to be taken seriously since proper insulation between the individual regions of the metallization 16 or between conductive regions lying below the metallization is no longer ensured on account of the cracks 12.

SUMMARY

One embodiment of the invention specifies a semiconductor component whose functioning is not impaired, or is impaired only to a small extent, in the event of cracking in the passivation layer.

The semiconductor component according to one embodiment of the invention has a semiconductor body and also a metal/insulation structure arranged above the semiconductor body and having a plurality of metal regions and insulation regions laterally adjoining one another. The metal regions serve for supplying the semiconductor body with electric current. Furthermore, the semiconductor component has a passivation layer arranged on the metal/insulation structure. The passivation layer includes a metal or a metal-containing compound.

In one embodiment, the passivation layer includes NiP, NiB, NiMoP, NiMo, CoW, NiRe, W or TiN or a combination of such elements/compounds. If W, Ti or TiN or a combination of these metals is used, then in the case where a sputtering process is used, conductive connections between the interconnects are interrupted, for example by means of photopatterning.

In one embodiment, passivation layer made of metal or a metal-containing compound has a very high tear strength. In addition, the adhesion between such materials and the materials usually used for the insulation regions (for example, oxide, nitride, SiC, oxide-nitride or a combination of these materials) is only very weak. This means that cracks in the passivation layer that run above an insulation region can propagate into the insulation region only with very great difficulty. This means that the probability that cracks running above the insulation regions will lead to the total failure of the semiconductor component is relatively low.

In one embodiment, the passivation layer includes NiP or NiMoP and the material of the metal regions is aluminum.

The direct bonding of bonding wires on the passivation layer is occasionally problematic since not every passivation layer material is suitable for utilization as a bonding contact area. In one embodiment, therefore, at least partial regions of the passivation layer are coated with thin layers made of Pd or Au that serve as bonding contact areas, so that an electric current can be fed to the semiconductor body via the Pd or Au layer, the passivation layer and the metal/insulation structure connected thereto.

In one embodiment, thicknesses of the passivation layer are between 50 nm and 5 μm. However, the invention is not restricted to such thickness ranges.

Not only the passivation layer itself but also a metal region lying beneath the passivation layer may be damaged by the tensile forces already described which act on the passivation layer in the lateral direction. Thus, in the event of large tensile forces, deformations occur in the metal regions and, in the extreme case, may lead to specific metal regions being bent over or torn away.

In order to avoid this in one embodiment, the metal regions may be pervaded by stabilization structures. For this purpose, the metal regions are in each case divided into a plurality of metal subregions that are arranged alongside one another and are spaced apart from one another, and the free spaces situated between the metal subregions are (at least partly) filled by the passivation layer in such a way that the metal subregions are electrically connected to one another by the passivation layer. Parts of the metal regions are thus replaced by other conductive materials (the conductive material of the passivation layer). The metal regions are pervaded by conductive stabilization structures in this way. The stabilization structures may also be formed by cutouts in the metal regions which are at least partly filled by the passivation layer.

In the forgoing description, it had been assumed that the passivation layer covers the whole metal/insulation structure. However, it is also possible that the passivation layer covers only a part of the metal/insulation structure. In this case, the part of the metal/insulation structure that is not covered by the passivation layer is then directly covered by the molding compound. In one embodiment, it is possible to sufficiently reduce external forces directed onto the metal/insulation structure even if the passivation layer covers only a part of the metal/insulation structure. Good results can be achieved for example already if the part of the metal/insulation structure covered by the passivation layer substantially only includes the outer corners and/or the outer edges of the metal regions.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 illustrates a detail from the power semiconductor component illustrated in FIG. 1 in the case of tensile stress in the lateral direction.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 4:
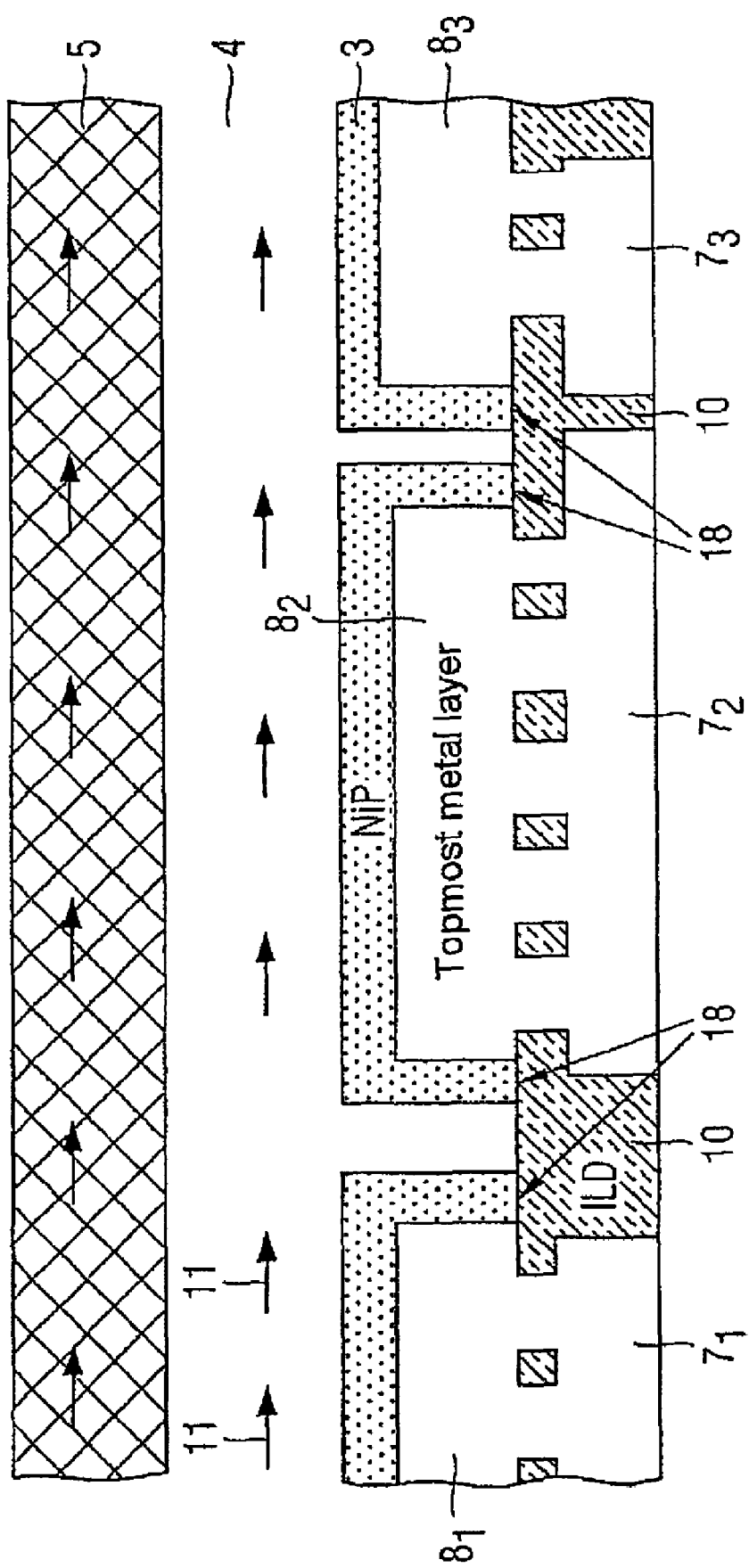
FIG. 4 illustrates a detail from a first embodiment of the semiconductor component according to the invention in a cross-sectional illustration.

FIG. 4 illustrates a first embodiment of the semiconductor component according to the invention. The essential difference between this embodiment and the embodiment illustrated in FIG. 2 consists in the fact that the material of the passivation layer 3 includes a metal or a metal-containing compound. The material of the passivation layer 3 is in one case NiP or NiMoP. The consequence of using this material is that the passivation layer, at the locations identified by reference numeral 18, does not adhere or adheres extremely weakly on the insulation structures 10. If a crack arises within the passivation layer 3 above the insulation structures 10 or propgoates in the direction of the insulation structures 10, then said crack has only a very low probability of "jumping over" to the insulation structure 10 and thus damaging the latter, since the passivation layer 3 does not adhere on the regions 18. As already mentioned, the use of such a passivation layer material furthermore has the advantage that the tear strength of the passivation layer 3 is very high.

Figure 5:
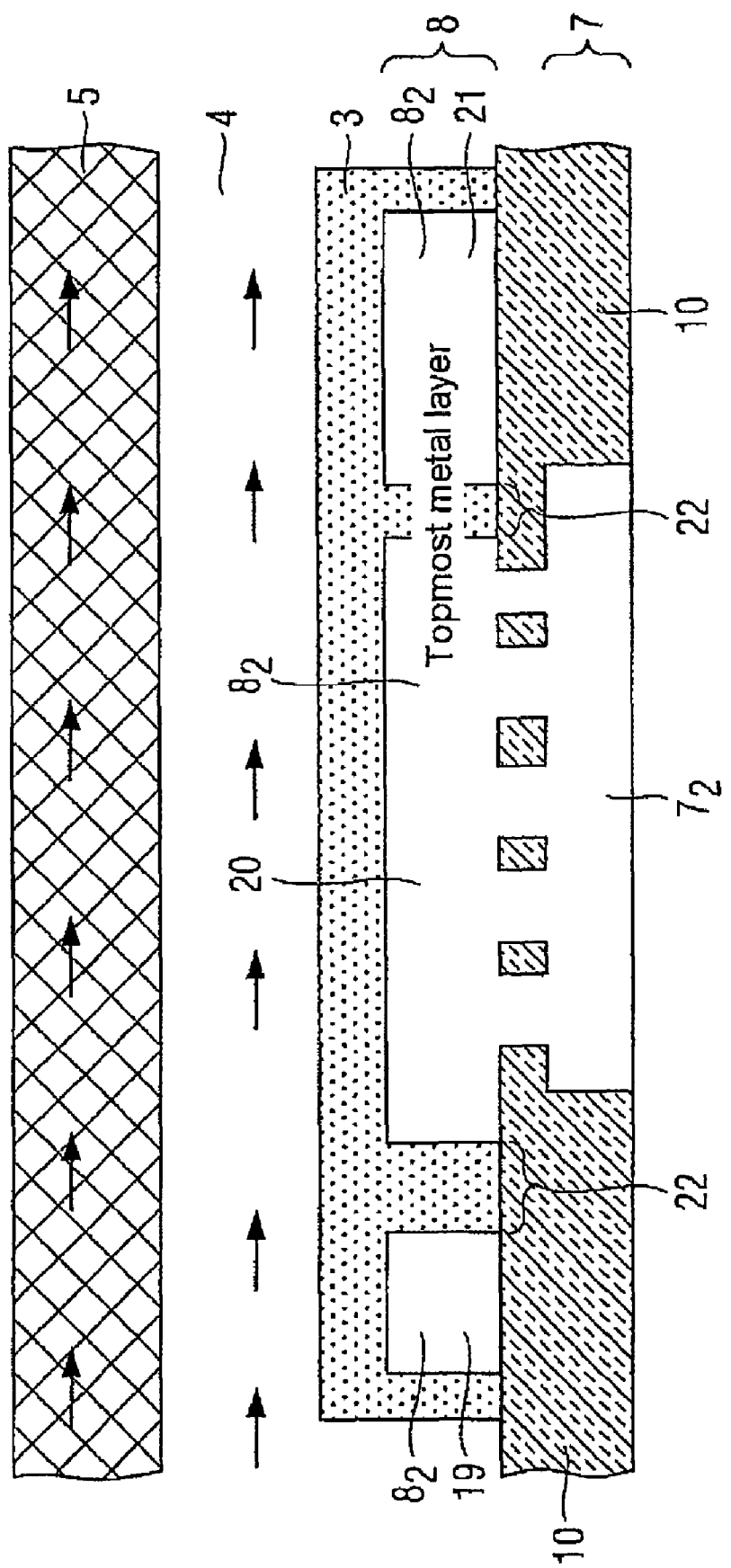
FIG. 5 illustrates a detail from a second embodiment of the semiconductor component according to the invention in a cross-sectional illustration.

FIG. 5 illustrates an embodiment in which a metal region of the topmost metal plane 8, for example the metal region $8_2$, is divided into a plurality of metal subregions 19, 20 and 21. The metal subregions 19, 20, 21 are separated from one another by free spaces 22 that are filled by the passivation layer 3. The passivation layer 3 thus electrically connects the metal subregions 19 to 21 to one another. The free spaces 22 filled with passivation layer material constitute stabilization structures that pervade the metal region $8_2$. In this way it is possible to prevent a deformation of the metal region $8_2$.

Figure 6:
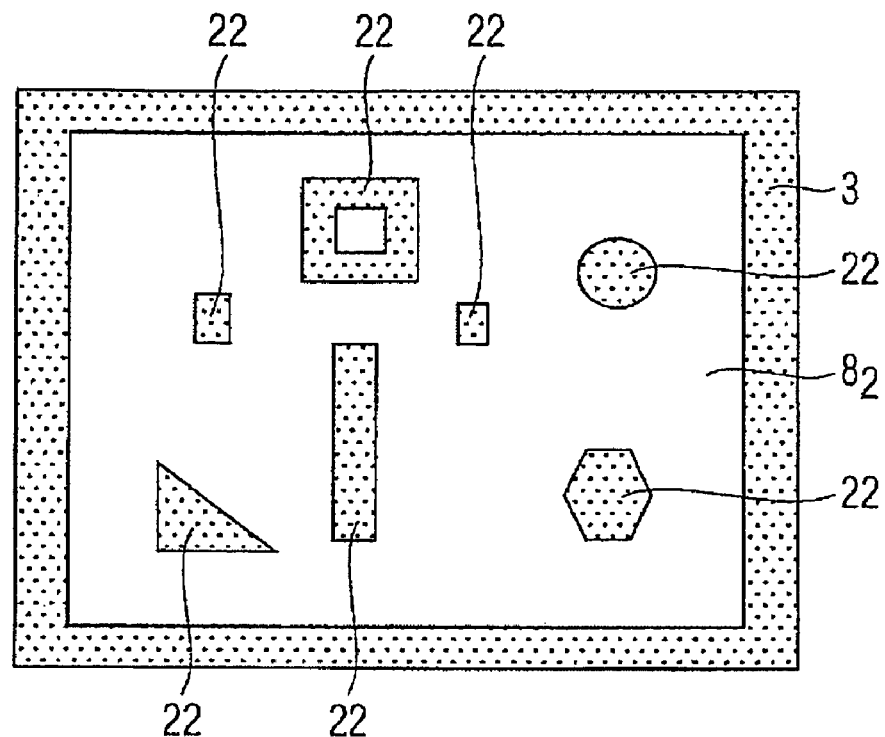
FIG. 6 illustrates one embodiment of a metal region in a semiconductor component according to the invention in plan view.
Figure 7:
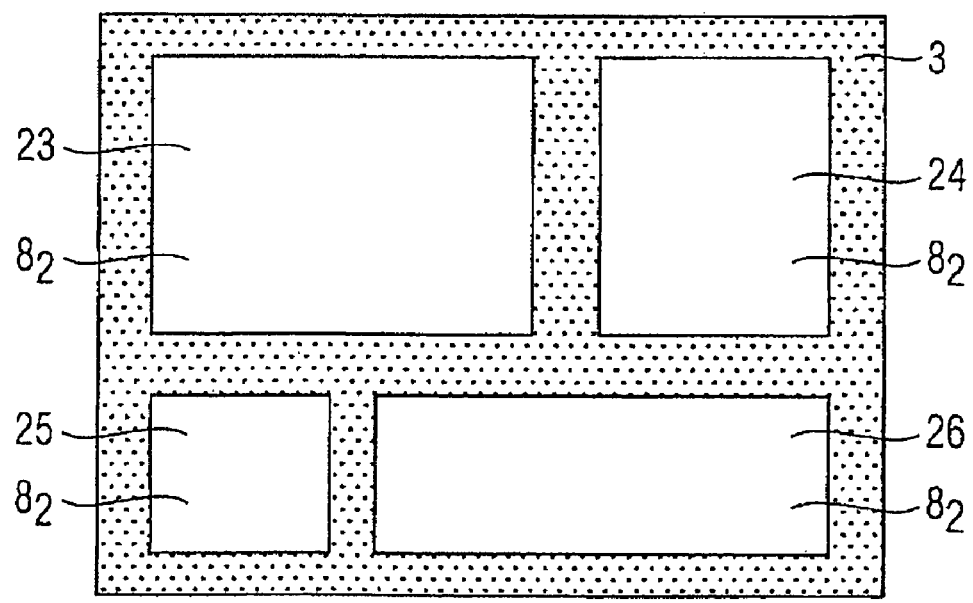
FIG. 7 illustrates a further embodiment of a metal region in a semiconductor component according to the invention in plan view.

FIGS. 6 and 7 illustrate plan views of a horizontal cross section of a metal region, for example of the metal region $8_2$. The metal region $8_2$ is pervaded by vertically running cutouts (trenches, holes) 22 which, as indicated in FIG. 6, may have any desired geometrical shapes.

FIG. 7 illustrates that the cutouts 22 may also be embodied in the form of contiguous trenches. In this embodiment, the metal region $8_2$ is divided into four metal subregions 23, 24,

25 and 26. The cutouts 22 form stabilizing transverse bracing and prevent damage to the metal subregions 23, 24, 25 and 26 through deformation or tearing away in the event of high tensile forces in the lateral direction.

Figure 8:
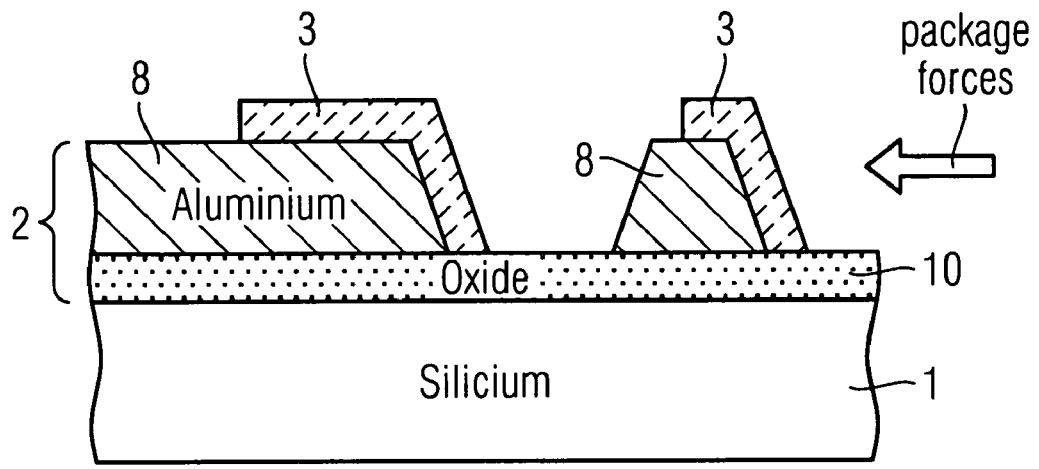
FIG. 8 illustrates a detail from a third embodiment of the semiconductor component according to the invention in a cross sectional illustration.
Figure 9:
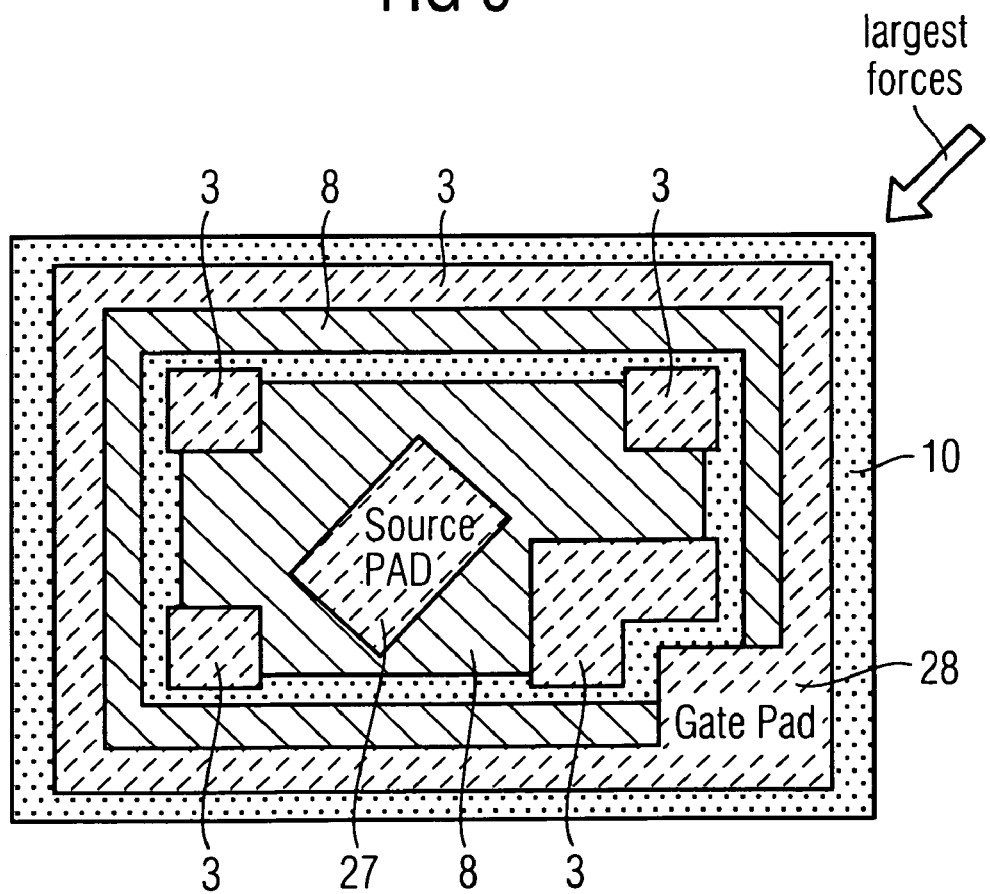
FIG. 9 illustrates a detail from the third embodiment of the semiconductor component according to the invention in plan view.

In the embodiments described so far the complete metal/insulation structure 2 is covered by the passivation layer 3. FIG. 8 illustrates the case where the passivation layer 3 (here: NiMoP) covers only a part of the metal/insulation structure 2. The part of the metal/insulation structure 2 which is not covered by the passivation layer 3 may then be directly covered by the molding compound 5. This embodiment bases on the realization of the inventors that already a part of the passivation layer 3 is sufficient to reduce forces applied from outside (from the molding compound 5) onto the metal/insulation structure 2 remarkably. Good results can be achieved for example with the embodiment illustrated in FIG. 8, in which the part of the metal/insulation structure 2 covered by the passivation layer 3 includes substantially only the outer corners and/or the outer edges of the metal regions 8. FIGS. 8 and 9 illustrate a single transistor having a gate metallization (outer region of the metal region 8) as well as a source metallization (inner region of the metal region 8). A source pad 27 as well as a gate pad 28 illustrated in FIGS. 8 and 9 are part of the (structured) passivation layer 3 and serve also as mechanical stabilization elements.

The embodiment illustrated in FIGS. 8 and 9 illustrates that it is not necessary to "encapsulate" all aluminum regions with NiMoP. Instead, it is also possible to cover only parts of the aluminum regions. Since NiMoP is considerably firmer as aluminum, it is possible to prevent shifted/displaced aluminum lines. The corners of aluminum regions are subjected to the highest risk of being damaged by external forces. It has to be mentioned that it is not absolutely necessary to cover the side walls of the aluminum regions with passivation material (for example NiMoP). It may also be sufficient to only cover parts on the top surface of the aluminum regions (that is, excluding the side walls) with passivation material strengthening elements. In this way, the aluminum regions are only partially strengthened against external forces (forces supplied by the molding compound).

FIG. 8 illustrates an example of a single transistor having aluminum regions which are partially covered with an NiMoP passivation layer at the outer side of the aluminum regions. Since NiMoP is very rigid, it is possible to reduce forces applied to the corners over the whole conducting line. As a result, the conducting line is not significantly shifted towards the central region of the single transistor. The NiMoP passivation layer may for example be fabricated using a corresponding photo mask.

FIG. 9 illustrates a plan view of the single transistor illustrated in FIG. 8. The NiMoP strengthening elements are positioned on the outer conducting lines (on the outer surfaces of the conducting lines). If, as illustrated in FIG. 9, a source plate (inner aluminum region 8) is provided, a "minimalistic" approach may be adopted. That is, it may be sufficient to only strengthening the corners of the source plate using NiMoP (or also another material). The strengthening NiMoP elements may be arbitrary shaped elements like triangular elements or other polygon strengthening elements.

Further aspects of the invention will be discussed in the description below.

Figure 1:
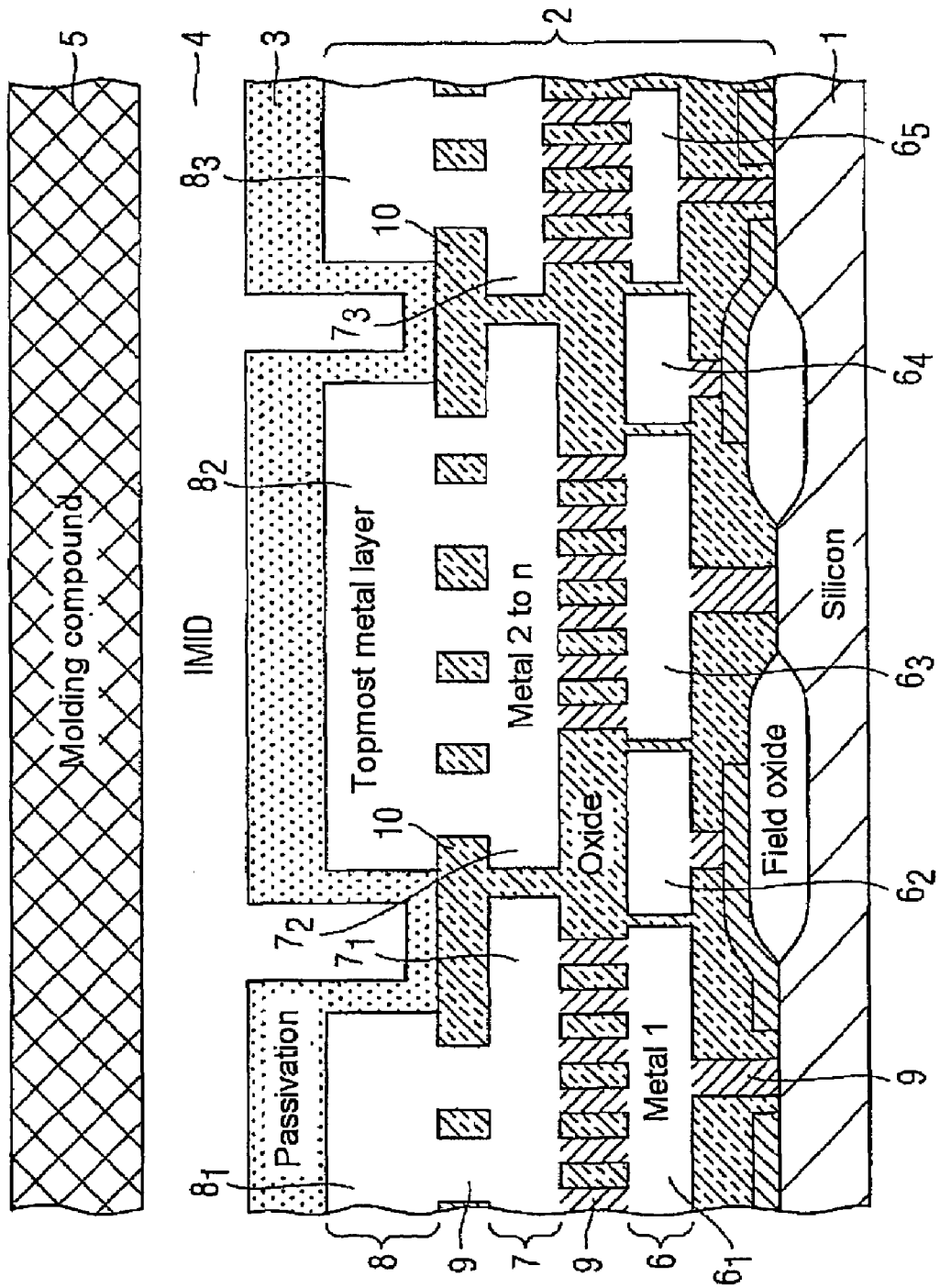
FIG. 1 illustrates a detail from a known power semiconductor component in a cross-sectional illustration.

In power IC technologies, large power DMOS transistors are generally positioned at the chip edges. The transistors have large metal plates, the sizes of which may be between a few 0.01 mm$^2$ and a few mm$^2$ and are insulated toward the molding compound of the plastic package with a several hundred nm thick passivation (FIG. 1). Since the chip, the leadframe on which the chip is fixed, and the molding compound have different coefficients of expansion, large tensile forces are exerted on the passivation. The topmost metal layer, comprising aluminum or copper, is often unable to absorb the forces ("Modeling of Die Surfaces Features on Integrated Circuits to Improve device Realiability," John Sauber; and "Thin film cracking and ratcheting caused by temperature cycling," M. Huang, Z. Sao). Therefore, passivation cracks occur and, if appropriate, failures of the chip during operation. The robustness of the chip is generally determined by running through a plurality of temperature cycles. In order to minimize the cracks, a buffer layer such as, for example, a polyimide is often provided between chip passivation and molding compound.

Figure 3A:
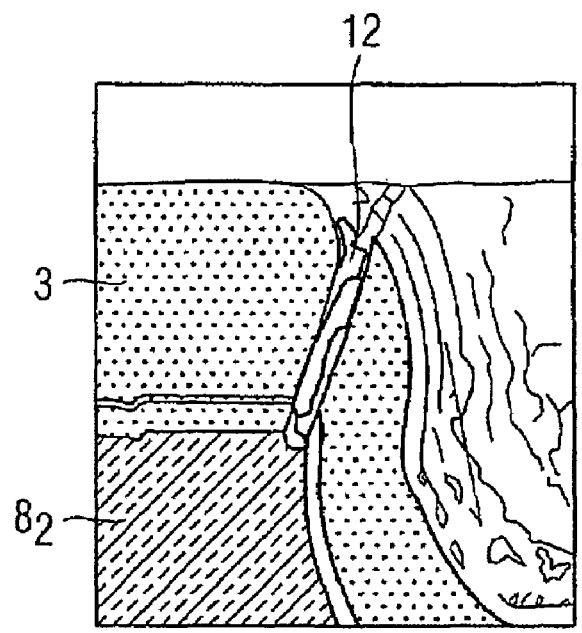
FIG. 3A illustrates a micrograph of a detail from FIG. 2.
Figure 3B:
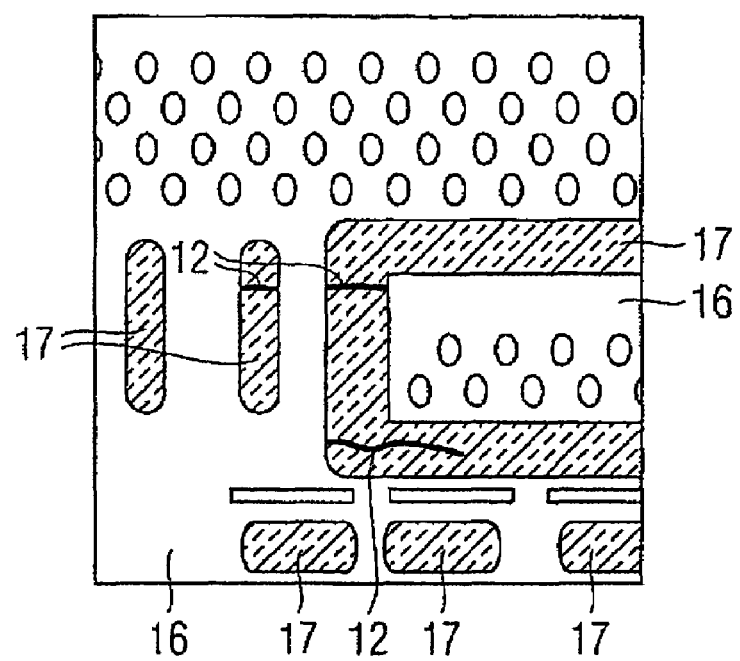
FIG. 3B illustrates a plan view of a detail from a known semiconductor component.

It has hitherto been possible to keep the cracks fairly small. As a result of the increasing miniaturization of the functions, planarization techniques such as CMP (chemical mechanical polishing) have recently been used in the metallization. These techniques lead to absolutely planar metallization surfaces. As a result, the molding compound forces can accumulate over the areas, resulting in a huge number of large cracks (FIGS. 2 and 3). If these cracks also propagate in the electrical insulation between the individual metallization planes (interlayer dielectric (ILD)), then moisture can penetrate into the chip. In the worst case, short circuits occur, for example, if metal is pressed into the cracks.

These effects are manifested to an increased extent if, due to the miniaturization, the topmost metal layer turns out to be thick in order to take up higher current densities. The deformability (plasticization) of aluminum increases as a result. This may lead to "tilting over" metal lines.

Since the cracks in principle arise at the edges of the topmost metal layer and then run along the latter downward into the ILD (FIG. 3), it is necessary either to prevent the cracking itself or to prevent the crack from running into the ILD. Furthermore, the passivation should be provided such that the metal track to be passivated retains its form on account of the shearing forces induced by the molding compound, since a decrease in the electromigration (reliability of the metal track to be passivated under current) must otherwise be reckoned with. These requirements can be achieved by means of a coating of the topmost metal tracks by a metal (FIG. 2).

Metals have a considerably higher tear strength in comparison with the passivation layer materials generally used (nitrides and oxides). NiP or NiMoP is used in one embodiment. The NiP or NiMoP may be deposited autogalvanically, for example. In one case, passivation layer thicknesses lie between 50 nm and 5 μm. NiP or NiMoP material does not tear as readily as an oxide or a nitride, and it adheres on aluminum, but not on the underlying ILD. It is thus unlikely that a crack in the NiP or NiMoP will jump over to the ILD. Since the NiP or NiMoP is very hard, the aluminum cannot deform either.

In order to keep large aluminum regions dimensionally stable despite the huge forces brought about by the molding compound, large aluminum regions (more generally: the topmost metallization) can be patterned into smaller regions (see FIG. 5). The resulting distances between the smaller regions should in one case, however, turn out to be less than twice the thickness of the passivation layer (NiP or NiMoP) in order that the smaller regions are electrically connected to one another again via the NiP or NiMoP. The patterning of the topmost metallization can be carried out in various ways: firstly it is conceivable to introduce holes of whatever form into the topmost metal layer, which are filled either completely or only partly with NiP or NiMoP (see FIG. 6). In the latter case, the sheet resistance increases and is therefore not desirable. Another possibility is to decompose the metal layer into separate metal regions which are then electrically connected again via the NiP or NiMoP of the passivation layer (see FIG. 7).

Since the bonding reliability on Nip or the NiMoP is not very high, an additional Pd, Au or Pd/Au deposition on the NiP used in one embodiment. These layers can turn out to be very thin and in one case are used in the region of the pads for connection of the bonding wires. Such layers would not be a disturbance on the rest of the NiP (NiMoP), however, so that these layers can be deposited there as well (that is to say over the whole area of the passivation layer). The adhesion between the topmost metallization passivated in this way and the buffer layer (in one case imide) or the molding compound may be produced if no buffer layer is used, by means of a chemical or mechanical adhesion promoter (an adhesion promoter is comparable with an adhesive. By way of example, it is possible to use imide as adhesion promoter between a chip passivation and a molding compound). Furthermore, it is possible to use imides and molding compounds which simultaneously adhere on noble metals and ILD layers.

In one embodiment of the invention, accordingly, replaces the oxide or nitride passivation of the topmost metal layer by a passivating metal such as NiP, NiB, NiMo, NiMoP, CoW, CoWP or NiRe. Other metals such as W or TiN are also conceivable. These layers cannot be deposited selectively, for which reason an additional selective removal process is used. NiP, NiB, NiMo, NiMoP, CoW, CoWP or NiRe do not adhere in principle on ILDs. Thus, cracks that are induced in them owing to the large shearing forces present cannot run into the ILD.

FIG. 5 illustrates that tensile forces arise on account of the different coefficients of thermal expansion essentially in the molding compound, which generally expands or contracts eight times more than the silicon chip and metallization. The tensile forces are reduced somewhat by means of the buffer layer 4 (in one case imide) and are directed from outside into the interior of the chip since the molding compound is injected at approximately 180° C. around the chip. The operating temperature of the chip generally lies below that.

Since NiP is conductive in comparison with the metals used as standard (Al and Cu), conductive transverse bracing can be incorporated by means of NiP. Said transverse bracing stabilizes the topmost metal layer with respect to the shearing forces from the molding compound.

FIG. 6 illustrates a horizontal section through a large metal layer, revealing the side wall passivation and the patterned metal layer to be passivated. The transverse bracing may be regions within the topmost metal layer. They need not be contiguous. FIG. 7 illustrates that continuous transverse bracing is also possible. The latter should rather be used in the case of large metal regions.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component, comprising:
    a semiconductor body;
    a metal/insulation structure arranged above the semiconductor body as an uppermost metal/insulation structure of the semiconductor component and having a plurality of metal regions and insulation regions laterally adjoining one another, the metal regions configured to supply the semiconductor body with electric current; and
    a passivation layer covering exposed surfaces of the metal regions and exposed surfaces of the insulation regions of said uppermost metal/insulation structure that are not covered by the metal of the metal regions, said passivation layer being deposited as a sole layer of a uniform passivation material and configured to minimize influences of the environment and to avoid or minimize adverse effects on a function of the semiconductor component in the event of cracking in the passivation layer;
    wherein said uniform passivation material is a metal or a metal containing compound which has a high tear strength and a low adhesion strength on the insulation regions.

2. The semiconductor component of claim 1, wherein the uniform passivation material is one or more of a group comprising NiP, NiB, NiRe, NiMoP, NiMo, CoW, Ti and TiN.

3. The semiconductor component of claim 2, wherein a layer made of one or more of a group comprising Pd and Au is arranged on the sole passivation layer.

4. The semiconductor component of claim 1, wherein the thickness of the sole passivation layer is between 50 nm and 5 µm.

5. The semiconductor component of claim 1, wherein at least one of said metal regions is divided into a plurality of metal subregions that are arranged alongside one another and are spaced apart from one another, free spaces situated between the metal subregions being at least partly filled by the sole passivation layer in such a way that the metal subregions are electrically connected to one another by the passivation layer.

6. The semiconductor component of claim 1, wherein at least one of said metal regions has a cutout, which is at least partly filled by the sole passivation layer.

7. The semiconductor component of claim 1, wherein the shape and dimension of the sole passivation layer are chosen such that external forces directed onto the metal/insulation structure are reduced significantly and the metal or metal-comprising compound has a high tear strength against tensile forces acting on account of thermal expansion on the passivation layer in the lateral direction.

8. The semiconductor component of claim 1, wherein the part of the metal/insulation structure covered by the sole passivation layer includes the outer corners and/or the outer edges of at least one metal region.

9. A semiconductor component comprising:
    a semiconductor body;
    a plurality of metal regions above the semiconductor body configured to supply the semiconductor body with electric current;
    insulating regions above the semiconductor body and laterally adjoining the metal regions, said plurality of metal regions and said insulating regions being provided as an uppermost metal/insulation structure of the semiconductor component;
    a passivation layer covering exposed surfaces of the metal regions and exposed surfaces of the insulation regions of the uppermost metal/insulation structure that are not covered by a metal of the metal regions;
    wherein the passivation layer is deposited as a sole layer of a uniform passivation metal material or passivation metal compound material being selected for providing the passivation layer with a very high tear strength, the adhesion between said metal or metal compound and the insulating region being very weak.

10. The semiconductor component of claim 9, wherein the uniform passivation material is a metal-containing compound.

11. The semiconductor component of claim 10, wherein the uniform passivation material comprises one or more of a group comprising NiP, NiB, NiRe, NiMoP, NiMo, CoW, Ti and TiN.

12. The semiconductor component of claim 9, wherein the thickness of the sole passivation layer is between 50 nm and 5 μm.

13. The semiconductor component of claim 9, wherein at least one of said metal regions is divided into a plurality of metal subregions that are arranged alongside one another and are spaced from one another, free spaces situated between the metal subregions being at least partly filled by the sole passivation layer in such a way that the metal subregions are electrically connected to one another by the passivation layer.

14. The semiconductor memory component of claim 9, wherein at least one of said metal regions has a cutout, which is at least partly filled by the sole passivation layer.

15. The semiconductor memory component of claim 9, wherein the sole passivation layer covers only a part of the metal/insulation structure.

16. A method for fabricating a semiconductor component comprising:
    fabricating a semiconductor body;
    arranging a metal/insulating structure above the semiconductor body, the metal/insulation structure being an uppermost metal/insulation structure of the semiconductor component and having a plurality of metal regions and insulation regions arranged laterally joining one another;
    depositing a sole layer of a uniform metal-containing or a metal compound containing passivation material to cover exposed surfaces of the metal regions and exposed surfaces of the insulation regions of the uppermost/insulating structure that are not covered by the metal of the metal regions, wherein the metal or the metal compound contained in the sole layer of passivation material is selected such that the passivation layer has high tear strength and low adhesion strength on the insulation regions.

17. The method of claim 16, further comprising depositing the sole passivation layer with a material selected from a group comprising NiP, NiB, NiRe, NiMoP, NiMo, CoW and TiN.

18. The method of claim 17, further comprising arranging a layer on the sole passivation layer a layer of a material selected from a group comprising Pd and Au.

19. The method of claim 16, wherein the thickness of the sole passivation layer is between 50 nm and 5 μm.

* * * * *